(12) United States Patent
Kim et al.

(10) Patent No.: US 10,690,811 B2
(45) Date of Patent: Jun. 23, 2020

(54) STRUCTURE HAVING LOW REFLECTANCE SURFACE AND METHOD FOR MANUFACTURING THE STRUCTURE, AND SOLAR CELL AND OPTICAL FILM HAVING THE STRUCTURE

(71) Applicant: Ajou University Industry-Academic Cooperation Foundation, Suwon-si, Gyeonggi-do (KR)

(72) Inventors: Chang-Koo Kim, Seoul (KR); Jun-Hyun Kim, Seongnam-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 0 days.

(21) Appl. No.: 16/057,128

(22) Filed: Aug. 7, 2018

(65) Prior Publication Data
US 2019/0049628 A1 Feb. 14, 2019

(30) Foreign Application Priority Data

Aug. 8, 2017 (KR) .................. 10-2017-0100465

(51) Int. Cl.
| | |
|---|---|
| *H01L 31/054* | (2014.01) |
| *H01L 33/46* | (2010.01) |
| *G02B 1/11* | (2015.01) |
| *H01L 31/0236* | (2006.01) |
| *H01L 31/028* | (2006.01) |
| *G02B 1/12* | (2006.01) |
| *G02B 5/02* | (2006.01) |
| *H01L 33/44* | (2010.01) |
| *H01L 31/18* | (2006.01) |

(52) U.S. Cl.
CPC ................ *G02B 1/11* (2013.01); *G02B 1/12* (2013.01); *G02B 5/0294* (2013.01); *H01L 31/028* (2013.01); *H01L 31/02363* (2013.01); *H01L 31/054* (2014.12); *H01L 31/1804* (2013.01); *H01L 33/44* (2013.01); *H01L 33/46* (2013.01)

(58) Field of Classification Search
CPC . H01L 31/054; H01L 33/46; H01L 31/02363; H01L 31/028; H01L 21/02035; H01L 31/1804
USPC ......... 257/53, 72, 618; 438/48, 128, 149, 71
See application file for complete search history.

(56) References Cited

U.S. PATENT DOCUMENTS

2012/0024378 A1* 2/2012 Lee .................. H01L 31/02168
136/259

FOREIGN PATENT DOCUMENTS

| KR | 10-1996-0025434 A | 7/1996 |
|---|---|---|
| KR | 10-0855682 B1 | 9/2008 |
| KR | 10-2017-0052847 A | 5/2017 |

* cited by examiner

Primary Examiner — Thinh T Nguyen
(74) Attorney, Agent, or Firm — Sughrue Mion, PLLC

(57) ABSTRACT

The present disclosure provides a structure having a low reflectance surface, wherein the structure comprises: a base plate; and a plurality of inclined rods protruding from a first face of the base plate and inclined relative to a normal line to the first face, wherein the inclined rods are spaced from each other. Travel paths of light beams in the structure may be longer along the inclined rods. As a result, a larger amount of light may be absorbed by the structure having a low reflectance surface. The amount of light-beams as reflected from the structure having a low reflectance surface may be significantly reduced.

2 Claims, 5 Drawing Sheets

STRUCTURE HAVING LOW REFLECTANCE SURFACE AND METHOD FOR MANUFACTURING THE STRUCTURE, AND SOLAR CELL AND OPTICAL FILM HAVING THE STRUCTURE

CROSS-REFERENCE TO RELATED APPLICATIONS

This application claims the priority of Korean Patent Application No. 10-2017-0100465 filed on Aug. 8, 2017, in the Korean Intellectual Property Office, the disclosure of which is hereby incorporated by reference in its entirety.

BACKGROUND

1. Technical Field

The present disclosure relates to a structure having a low reflectance surface capable of absorbing incident light and reducing an amount of reflected light therefrom, a method for manufacturing the structure, and a solar cell and an optical film having the structure.

2. Description of the Related Art

Low reflectance surface techniques or anti-reflection techniques are used to suppress light reflection from the surface, and are applied to solar cells, displays, light-emitting diodes (LEDs), and the like. Such a low reflectance surface technique involves forming an antireflective film coating that changes refractive index to lower surface reflectivity, mainly using dielectric thin films including $SiO_x$, $SiN_x$, and the like. Alternatively, such a low reflectance surface technique may involve surface texturing that reduces the reflectivity of the incident light by forming a surface micro-concave and convex structure.

In the case of antireflection film coating, the antireflection film composed of a single thin film may realize a low reflectance surface only for a very limited optical wavelength range. Therefore, in order to realize a low reflectance surface for a wide range of wavelengths of light, a thin film of stacks of multiple layers respectively composed of materials with different refractive indices must be formed.

The low reflectance surface technique using the surface texturing involves the formation of a micro concave-convex surface structure including a cone-like structure such as a moth eye, a pyramid structure, a vertical column, and the like. In this technique, since the reflectivity is greatly influenced by the shape of the concavo-convex structure, it is necessary to develop an improved concave-convex structure for reducing the incident light.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a structure having a low reflectance surface that can reduce the amount of reflected light-beams by absorbing a large amount of light-beams by increasing the path of incident light-beams.

Another purpose of the present disclosure is to provide a method for making the structure having a low reflectance surface.

Still another purpose of the present disclosure is to provide a solar cell comprising the structure having a low reflectance surface.

Still another purpose of the present disclosure is to provide an optical film comprising the structure having a low reflectance surface.

The purposes of the present disclosure are not limited to the above-mentioned purposes. Other purposes and advantages of the present disclosure, as not mentioned above, may be understood from the following descriptions and more clearly understood from the embodiments of the present disclosure. Further, it will be readily appreciated that the objects and advantages of the present disclosure may be realized by features and combinations thereof as disclosed in the claims.

In one aspect of the present disclosure, there is provided a structure having a low reflectance surface, wherein the structure comprises: a base plate; and a plurality of inclined rods protruding from a first face of the base plate and inclined relative to a normal line to the first face, wherein the inclined rods are spaced from each other.

In one implementation of the structure, an angle between an inclination of the inclined rods and the normal line is in a range of about 20° inclusive to 80° inclusive.

In one implementation of the structure, each of protruding lengths of the inclined rods from the first face is in a range of 2 μm inclusive to 20 μm inclusive.

In another aspect of the present disclosure, there is provided a method for manufacturing a structure having a low reflectance surface, wherein the method comprises: forming an etch mask on a first face of a silicon substrate, wherein the etch mask includes a plurality of mask patterns spaced from each other; impinging plasma ions obliquely against the first face of the silicon substrate having the etch mask thereon, thereby to anisotropically-etch the silicon substrate inclinedly in a region thereof excluding a masked region by the mask; and removing the etch mask.

In one implementation of the method, anisotropically-etching the silicon substrate includes: providing a Faraday cage, wherein the cage has sidewalls made of a conductive material and a top horizontal meshed face on top edges of the sidewalls, and the meshed face is made of a conductive material, and ions pass through the meshed face; disposing the silicon substrate at an angle to the meshed face within the Faraday cage; and applying alternately SF6 plasma and C4F8 plasma to the first face of the substrate.

In one implementation of the method, the etch mask is made of silicon oxide.

In still another aspect of the present disclosure, there is provided a solar cell comprising: an emitter layer made of a first conductive type semiconductor material; and a light-absorbing layer made of a second conductive type semiconductor material opposite to the first conductive type and disposed below the emitter layer, wherein the light-absorbing layer forms a PN junction with the emitter layer, wherein the emitter layer has a first side facing the light-absorbing layer, and a second face opposite the first face wherein the emitter layer includes: a base plate made of single crystal or polycrystalline silicon; and a plurality of inclined rods projecting from the second face of the base plate and obliquely to a normal line of the second face, wherein the rods are spaced from each other.

In one implementation of the solar cell, an angle between an inclination of the inclined rods and the normal line is in a range of about 20° inclusive to 80° inclusive.

In one implementation of the solar cell, each of protruding lengths of the inclined rods from the second face is in a range of 2 μm inclusive to 20 μm inclusive.

An optical film disposed on a display face of a display panel to reduce a reflectance of external light, wherein the optical film comprises: a base film having a first face facing the display panel and a second face facing the first face; and a plurality of inclined rods projecting from the second face of the base film and obliquely to a normal line of the second face, wherein the rods are spaced from each other.

In one implementation of the optical film, the base film and the inclined rods are integrally formed and are made of a transparent polymer material.

In one implementation of the optical film, an angle between an inclination of the inclined rods and the normal line is in a range of about 20° inclusive to 80° inclusive.

In one implementation of the optical film, each of protruding lengths of the inclined rods from the first face is in a range of 2 μm inclusive to 20 μm inclusive.

In accordance with the present disclosure, when the inclined rods are projected in an inclined direction other than a direction perpendicular to the surface of the base plate, this can significantly reduce the reflectance of incident light-beams. Specifically, when the light beams are incident on the surface of the base plate, the travel paths thereof may be longer along the inclined rods. As a result, a larger amount of light may be absorbed by the structure having a low reflectance surface. The amount of light-beams as reflected from the structure having a low reflectance surface may be significantly reduced.

Further, according to the present disclosure, when the structure having a low reflectance surface is applied to a solar cell, the light efficiency of the solar cell can be remarkably improved.

Furthermore, according to the present disclosure, when the structure having a low reflectance surface is applied to an optical film, this can provide a clear image to a user while minimizing optical loss.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTIONS

Figure 1:
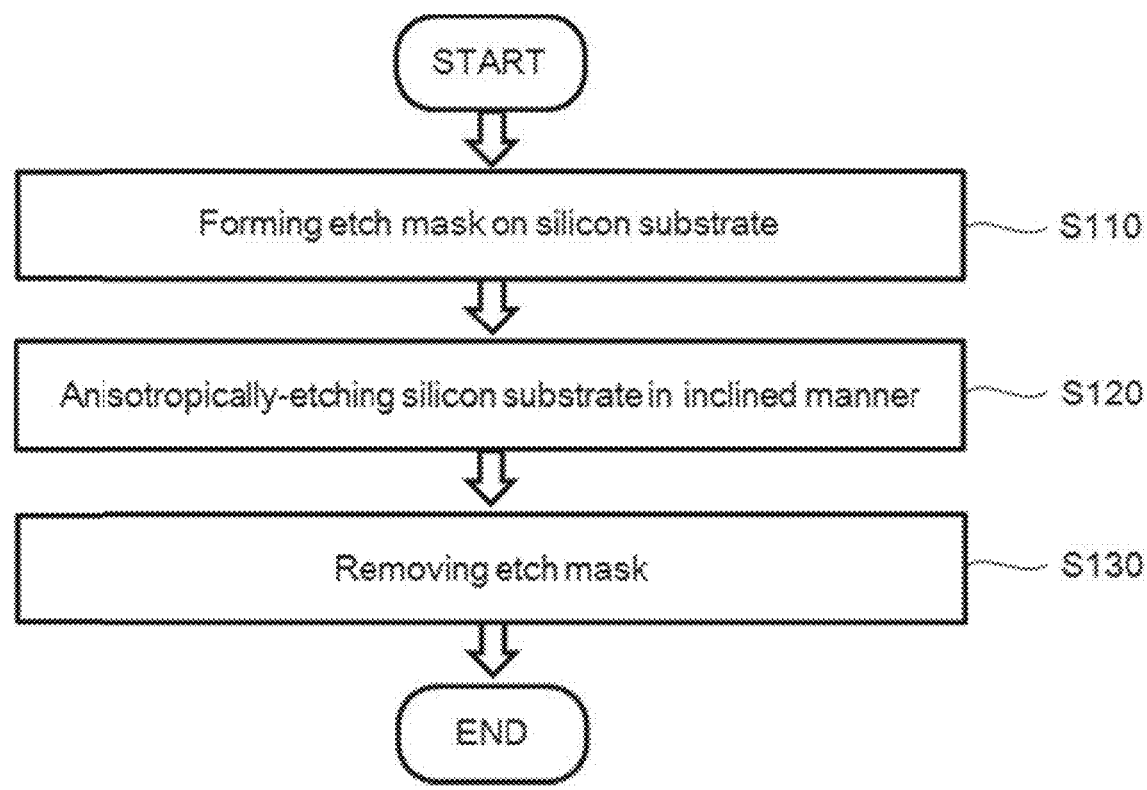
FIG. 1 is a flow chart to illustrate a method for fabricating a structure having a low reflectance surface according to an embodiment of the present disclosure.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure."

Figure 2A:
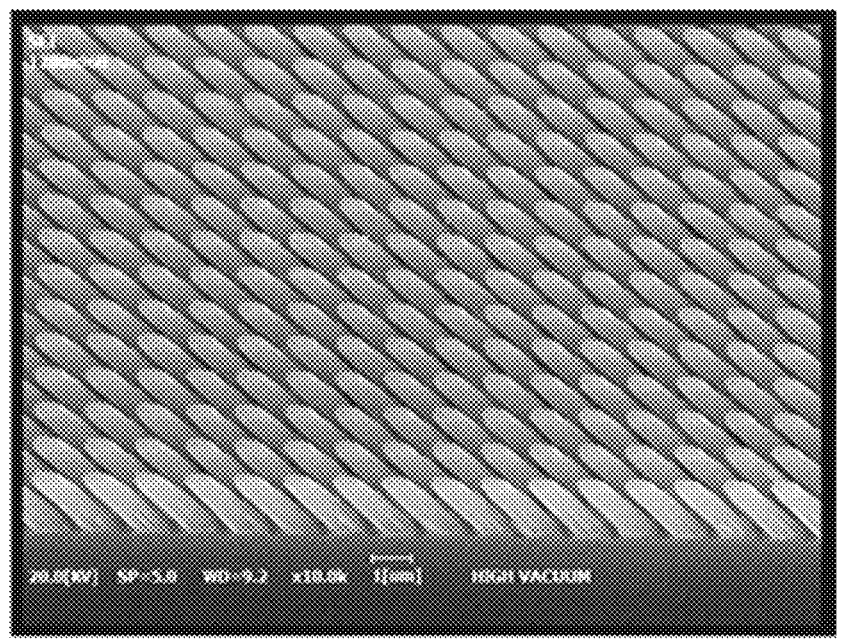
FIG. 2a is an image for explaining the structure having a low reflectance surface fabricated according to the embodiment of the present disclosure.
Figure 2B:
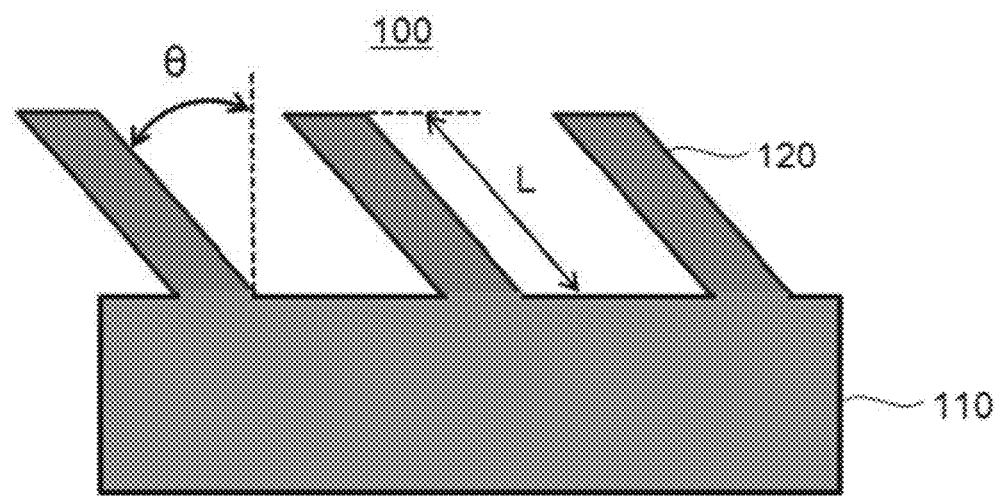
FIG. 2b is a cross-sectional view illustrating inclined rods of the structure having a low reflectance surface.

FIG. 1 is a flow chart to illustrate a method for fabricating a structure having a low reflectance surface according to an embodiment of the present disclosure. FIG. 2a is an image for explaining the structure having a low reflectance surface fabricated according to the embodiment of the present disclosure. FIG. 2b is a cross-sectional view illustrating inclined rods of the structure having a low reflectance surface.

Referring to FIGS. 1, 2a and 2b, a method for fabricating a structure having a low reflectance according to an embodiment of the present disclosure includes a first step S110 of forming an etch mask on a silicon substrate; a second step S120 of etching the silicon substrate in an inclined manner using the etch mask; and a third step S130 of removing the etch mask.

In the first step S110, the silicon substrate may have a single crystal or polycrystalline structure. For example, a silicon wafer may be used as the silicon substrate.

The etch mask may include a plurality of mask patterns formed on the surface of the silicon substrate. The mask patterns may be spaced from each other and have the same shape and size. For example, each of the mask patterns may have a shape including a circle, a polygon, and the like.

The etch mask may be made of a material that is not etched even when exposed to a plasma that may etch the silicon substrate.

In one embodiment, the etch mask may comprise silicon oxide. For example, the etch mask may be formed by oxidizing the surface of the silicon substrate to form a silicon oxide film, and then removing the silicon oxide film in a region other than a region corresponding to the etch mask. Alternatively, the etch mask may be formed by forming an oxidation prevention film exposing only the region corresponding to the etch mask on the surface of the silicon substrate, and then oxidizing only the region exposed through the oxidation protection film.

In the second step S120, anisotropic etching may be performed by impinging plasma ions obliquely against the surface of the silicon substrate having the etch mask thereon.

In one embodiment, a Faraday cage may be used to impinge plasma ions at an angle to the surface of the silicon substrate. The Faraday cage has sidewalls made of a conductive material and a top horizontal meshed face on top edges of the sidewalls. The meshed face is made of a conductive material. Ions may pass through the meshed face.

The Faraday cage forms a closed surface made of a conductor. Therefore, no electric field may exist in the Faraday cage. The electromagnetic field may be shielded from the cage so that an electromagnetic field outside the Faraday cage does not affect the inside of the cage.

For the second step S120, the silicon substrate is disposed at an angle to the meshed face in the Faraday cage. Thereafter, plasma etching is performed. For example, within the Faraday cage, the silicon substrate is disposed on a substrate support having an inclined support surface inclined relative to the meshed face. That is, the silicon substrate is disposed on the inclined support surface. Thereafter, the plasma etching is performed.

At this time, accelerated plasma ions from a sheath formed horizontally with respect to an outer opposite face of the inner meshed face pass through the open holes in the meshed face and maintain a direction perpendicular to the meshed face without disturbance of external force and, eventually, are incident on the silicon substrate. That is, plasma ions are inclinedly incident on the silicon substrate, thereby performing anisotropic etching on the silicon substrate.

As a result, inclined rods may be formed in the surface of the silicon substrate. The inclined rods have a horizontal cross-section corresponding to the mask pattern of the etch mask and are formed to be inclined with respect to the surface of the silicon substrate.

The plasma etching may be performed by a gas chopping process such as a Bosch process, a time-multiplexed deep etching (TMDE) process, or the like.

Specifically, an SF6 plasma serving as an etchant, and a C4F8 plasma for forming a passivation film are repeatedly applied to the silicon substrate. Thereby, an etching process having a high mask selectivity can be performed.

In the third step S130, the method for removing the etch mask is not particularly limited. For example, when the etch mask is made of silicon oxide, the etch mask may be removed by using a compound capable of reacting with the silicon oxide and dissolving the silicon oxide without reacting with the silicon substrate.

The structure 100 having a low reflectance surface as fabricated according to an embodiment of the present disclosure may include, as shown in FIGS. 2a and 2b, a base plate 110 and a plurality of inclined rods 120 projecting obliquely relative to the surface from the surface of the base plate 110.

The plurality of inclined rods 120 define the same oblique direction and oblique angle θ with respect to the normal line to the surface of the base plate 110. Each of the plurality of inclined rods 120 protrudes upward from the surface of the base plate 110. All of the protruding lengths L of the rods 120 from the surface of the base plate 110 may be the same.

In one example, the plurality of inclined rods 120 define the same oblique direction and oblique angle about 20 inclusive to about 80° inclusive with respect to the normal line to the surface of the base plate 110. Each of the plurality of inclined rods 120 protrudes upward from the surface of the base plate 110. All of the protruding lengths L of the rods 120 from the surface of the base plate 110 may be about 2 μm inclusive to 20 μm inclusive.

When the inclined rods 120 are projected in an inclined direction other than a direction perpendicular to the surface of the base plate 110, this can significantly reduce the reflectance of incident light-beams. Specifically, when the light beams are incident on the surface of the base plate 110, the travel paths thereof may be longer along the inclined rods 120. As a result, a larger amount of light may be absorbed by the structure 100 having a low reflectance surface. The amount of light-beams as reflected from the structure 100 having a low reflectance surface may be significantly reduced.

Figure 3:
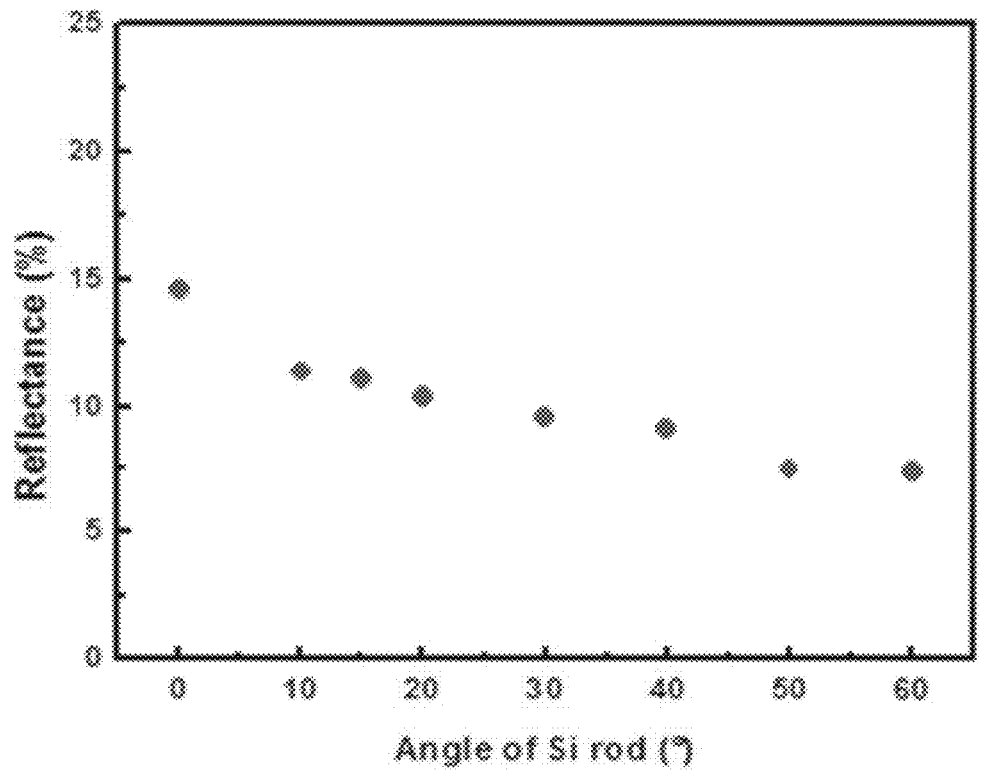
FIG. 3 is a graph showing the reflectance of light with a wavelength of 500 nm according to the angle between the inclination and the inclined rods and a normal line to a surface of the base plate.

FIG. 3 is a graph showing the reflectance of light with a wavelength of 500 nm according to the angle between the inclination of the inclined rods and the normal line to the surface of the base plate.

Referring to FIG. 3 along with FIGS. 2a and 2b, the reflectivity decreases as the angle between the inclination of the inclined rods and the normal line to the surface increases. However, it may be confirmed that the reflectance is not significantly reduced even when the inclination angle is increased in the range where the angle between the rod and the normal line is 20° or greater. In view of the above, it is preferable that the angle between the inclination of the inclined rods and the normal line to the surface is about 20° or larger. In one embodiment, in view of the structural stability of the structure having a low reflectance surface and the ease of the inclined-manner etching process, the angle between the inclination of the inclined rods and the normal line to the surface is preferably about 80° or smaller.

Figure 4:
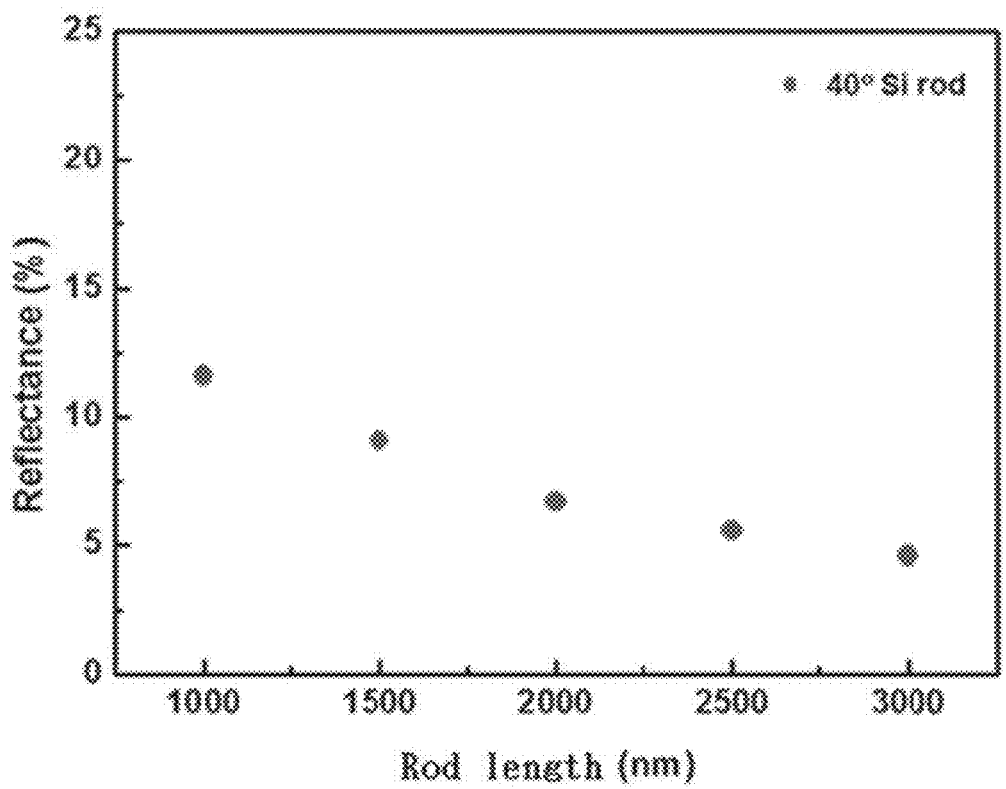
FIG. 4 is a graph showing the reflectance of light with a wavelength of 500 nm according to the length of each of the inclined rods.

FIG. 4 is a graph showing the reflectance of light with a wavelength of 500 nm according to the length of the inclined rods.

Referring to FIG. 4 with FIG. 2a and FIG. 2b, as the length of the inclined rods increases, the reflectance decreases. However, it may be confirmed that in the region where the length of the inclined rods is about 2000 nm or greater, the reflectivity does not decrease significantly even when the length of the inclined rods increases. In view of the above, the length of the inclined rods is preferably about 2 μm or greater. In view of the structural stability of the structure having a low reflectance surface and the ease of the inclined-manner etching process, the length of the inclined rods is preferably about 20 μm or smaller.

Figure 5:
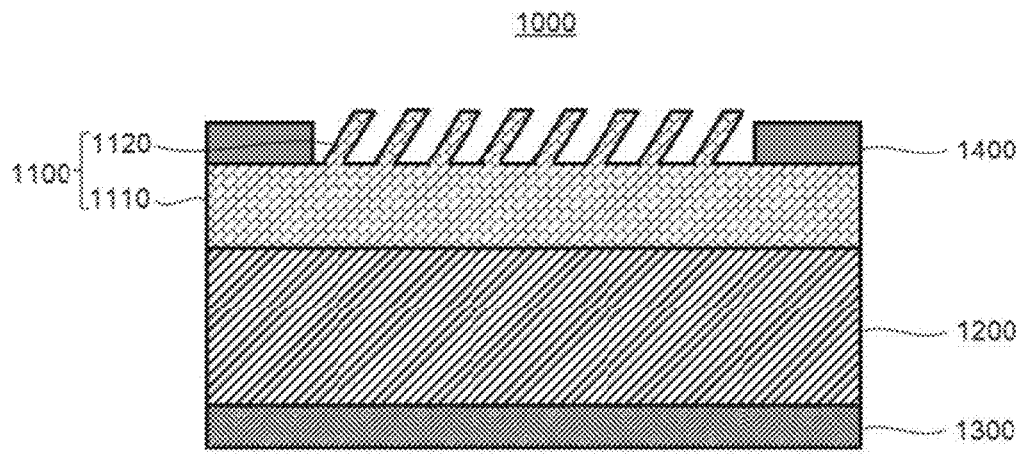
FIG. 5 is a cross-sectional view illustrating a solar cell according to an embodiment of the present disclosure.

FIG. 5 is a cross-sectional view illustrating a solar cell according to an embodiment of the present disclosure.

Referring to FIG. 5, a solar cell 1000 according to an embodiment of the present disclosure includes an emitter layer 1100, a light-absorbing layer 1200, a first electrode 1300, and a second electrode 1400.

The emitter layer 1100 may be made of a first conductive semiconductor material. For example, the emitter layer 1100 may be made of monocrystalline or polycrystalline silicon doped with P-type or N-type impurities.

The emitter layer 1100 may have substantially the same structure as the structure 100 having a low reflectance surface illustrated in FIGS. 1 to 4. In particular, the emitter layer 1100 may include the base plate 1110 and the inclined rods 1120 protruding from the top face of the base plate. Overlapping concrete examples of these are omitted.

The light-absorbing layer 1200 may be formed on the emitter layer 1100 and may include a second conductive semiconductor material different from the emitter layer 1100. For example, the light-absorbing layer 1200 may be made of silicon doped with P-type or N-type impurities and may form a p-n junction with the emitter layer 1100.

The first electrode 1300 may be disposed on the bottom face of the light-absorbing layer 1200. The second electrode 1400 may be disposed on the top face of the base plate 1110 of the emitter layer 1100. The first electrode 1300 and the second electrode 1400 may employ, without limitation to, a conductive material or a known electrode material. For example, the first electrode 1300 may be made of aluminum Al to generate a back electric field, while the second electrode 1400 may be made of silver having high conductivity.

According to the solar cell of the present disclosure, the emitter layer 1100 into which the light is incident includes the base plate 1110 and inclined rods 1120. This can significantly reduce the reflectance of the incident light-beams and, as a result, significantly improve the light efficiency of the solar cell.

Figure 6:
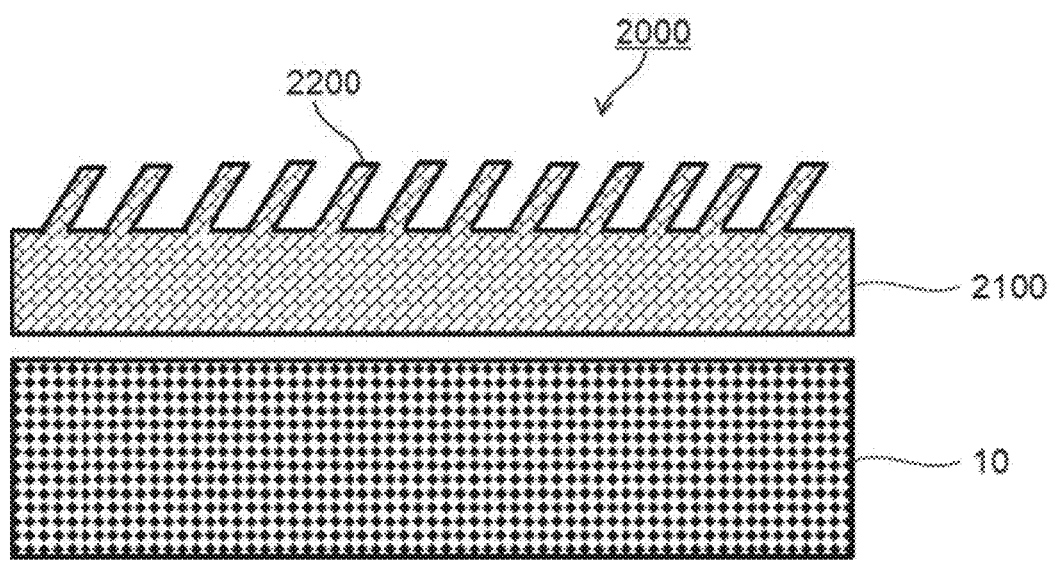
FIG. 6 is a cross-sectional view illustrating an optical film according to an embodiment of the present disclosure.

FIG. 6 is a cross-sectional view illustrating an optical film according to an embodiment of the present disclosure.

Referring to FIG. 6, an optical film 2000 according to an embodiment of the present disclosure may include a base film 2100 and inclined rods 2200 projecting obliquely upward from the surface of the base film 2100. The optical film 2000 has the same structure as the structure 100 having a low reflectance surface illustrated in FIGS. 1 to 4 and uses different materials. Therefore, overlapping detailed examples of the same components are omitted.

The optical film 2000 may be disposed on the display surface of the display panel 10 as shown in FIG. 6. In this case, the inclined rods 2200 may be disposed on the opposite face to the display panel 10 among both face of the base film 2100.

In one embodiment, the base film 2100 and the inclined rods 2200 may be integrally formed of a transparent polymeric material. In one embodiment, the optical film 2000 may be fabricated using the structure 100 having a low reflectance surface as illustrated with reference to FIGS. 1 to 4. For example, after forming a reverse shape mold structure to the surface of the structure 100 having the low reflectance surface with the inclined rods 120, the optical film 2000 may be manufactured using the mold structure.

The optical film 2000 of the present disclosure can transmit the internal light incident from the display panel 10 and reduce the reflectance of the external light incident from the outside. Thus, this may allow the user to clearly view the image displayed on the display panel 10 while minimizing the optical loss.

While the foregoing description of the present disclosure has been provided with reference to preferred embodiments of the present disclosure, those skilled in the art will appreciate that various modifications and changes may be made to the present disclosure without departing from the spirit and scope of the present disclosure set forth in the claims that follow.

What is claimed is:

1. A structure having a low reflectance surface, wherein the structure comprises:
   a base plate; and
   a plurality of inclined rods protruding from a first face of the base plate and inclined relative to a normal line to the first face, wherein the inclined rods are spaced from each other, wherein the inclined rods are made of s same material as the base plate, and wherein each of protruding lengths of the inclined rods from the first face is in a range of 2 μm inclusive to 20 μm inclusive.

2. The structure of claim 1, wherein an angle between an inclination of the inclined rods and the normal line is in a range of about 20° inclusive to 80° inclusive.

* * * * *